United States Patent [19]

Hebert et al.

[11] 4,000,397
[45] Dec. 28, 1976

[54] SIGNAL PROCESSOR METHOD AND APPARATUS

[75] Inventors: Raymond T. Hebert, Saratoga; John P. Ekstrand, Palo Alto, both of Calif.

[73] Assignee: Spectra-Physics, Inc., Mountain View, Calif.

[22] Filed: Mar. 21, 1975

[21] Appl. No.: 560,979

[52] U.S. Cl. .................... 235/61.11 E; 250/568
[51] Int. Cl.² .................. G06K 7/10; G08C 9/06
[58] Field of Search .............. 235/61.11 E, 61.7 R, 235/61.11 D, 153 AM; 340/146.1 AB, 169, 172.5, 146.3 K, 172; 250/566, 568, 569, 570; 360/33, 39, 40; 307/231; 329/104

[56]  References Cited
UNITED STATES PATENTS

| | | | |
|---|---|---|---|
| 3,304,542 | 2/1967 | Sutton | 340/172.5 |
| 3,653,029 | 3/1972 | Kuhlmann | 340/169 |
| 3,700,858 | 10/1972 | Murthy | 235/61.11 E |
| 3,716,699 | 2/1973 | Eckert | 235/61.11 E |
| 3,723,710 | 3/1973 | Crouse | 235/61.11 E |
| 3,849,632 | 11/1974 | Eckert | 235/61.11 E |
| 3,860,794 | 1/1975 | Knockeart | 235/61.11 E |
| 3,892,949 | 7/1975 | Dodson | 235/61.11 E |

*Primary Examiner*—Daryl W. Cook
*Assistant Examiner*—Robert M. Kilgore
*Attorney, Agent, or Firm*—Flehr, Hohbach, Test, Albritton & Herbert

[57] ABSTRACT

Method and apparatus for processing input binary encoded analog signals to precisely determine the time occurrence of positive-going and negative-going transitions. Such digital signals result, for example, when bar codes (e.g. Universal Product Codes) are optically scanned. Transitions are determined by detecting the zero crossings, at selected gating times, of the second derivative of the input signals. The selected gating times occur whenever the first derivatives of the input signals exceed a threshold level. The threshold level is determined in one embodiment by peak-to-peak detecting the input signals and adding this value to a rectified noise measurement signal.

15 Claims, 3 Drawing Figures

FIG.—1

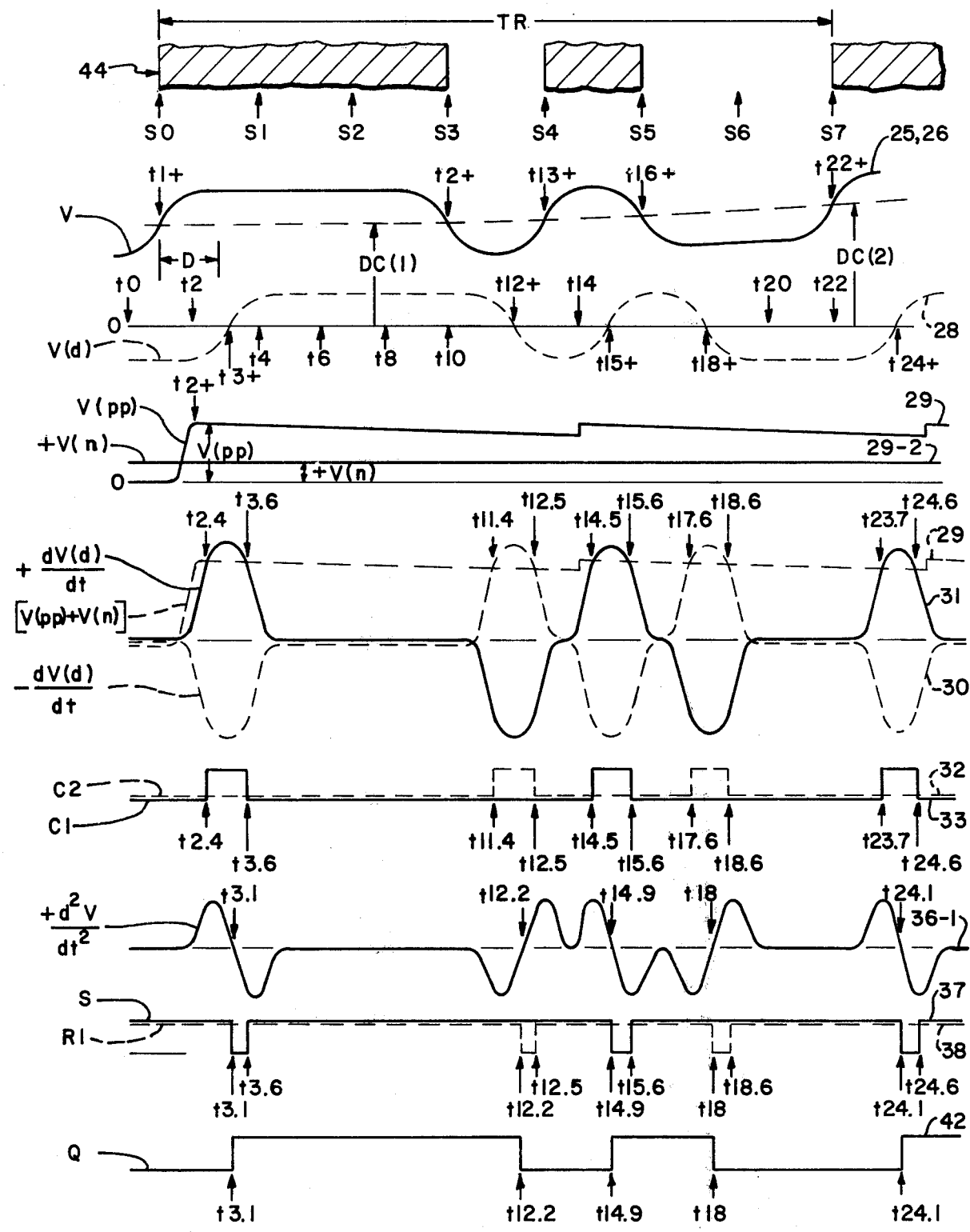
FIG.—3

SIGNAL PROCESSOR METHOD AND APPARATUS

CROSS REFERENCE TO RELATED APPLICATION

METHOD AND APPARATUS FOR READING CODED LABELS invented by Alfred P. Hildebrand, et al. Ser. No. 466,803, filed May 3, 1974, assigned to Spectra-Physics, Inc.

BACKGROUND OF THE INVENTION

This invention relates to method and apparatus for processing signals and more particularly, for detecting the transition points between the binary levels of signals.

Signals having transitions between binary levels are generated from many different devices. One device which generates such digital signals is described in the above-referenced application. In that application, Universal Product Code (UPC) symbols are optically scanned and detected to produce a video digital signal.

Codes like the Universal Produce Code are generally characterized as bar codes and consist of a series of parallel light and dark rectangular areas of different widths. In one Universal Product code, each character is represented by two dark bars and two light spaces. Different widths are selected for the bars and spaces in order to define different characters.

Packages are labeled using the UPC characters and electrooptical scanning apparatus scans the packages to detect the coded characters. The apparatus which scans the characters detects reflected light from the characters. The reflected light is incident upon a photomultiplier tube or other optical detector. The detector generates an electrical signal which has one level for dark bars and a second level for light spaces. Positive-going transitions and negative-going transitions occur in the electrical signals to signify transitions between bars and spaces. The transitions in the electrical signals are not perfectly sharp, but rather, tend to be spread out so that it is difficult to determine the exact instant at which the transition has occurred.

As a practical matter, in many instances it is not possible to produce signals with precisely-defined transitions. Therefore, signals are further processed to determine the point at which transitions occur.

Various circuits are known for carrying out such signal processing. These signal processing circuits typically include filters for removing unwanted components. Also, threshold devices have been employed for rejecting components which do not exceed a predetermined level. Although many signal processing techniques have been employed, a need still exists for improved signal processors which provide an ability to precisely detect transitions in such signals.

In view of the above background, it is an objective of the present invention to provide an improved signal processor which accurately and precisely determines the time of transitions between binary levels of encoded analog signals.

SUMMARY OF THE INVENTION

The present invention is a method and an apparatus for accurately and precisely detecting the time of transitions between binary levels of encoded analog signals. In the method of the invention, an input signal to be processed is double differentiated to form a second derivative signal. Zero crossings of the second derivative signal are detected, during selected gating periods, to signify the precise time of a transition. The selected gating periods are determined using a first derivative signal formed by differentiating the input signal. Whenever the first derivative signal exceeds a threshold level, the gating period is present and the second derivative signal is detected for zero crossings.

In one embodiment of the present invention, the threshold level is formed by peak detection of the input signal.

In accordance with another embodiment of the present invention, a peak-to-peak detection signal and a noise measurement signal are added to form the threshold level. The noise measurement signal is formed, in one embodiment, by rectifying the noise signal components at frequencies above the frequency band of the input signal's information content.

In accordance with one embodiment the present invention, an apparatus for carrying out the above methods includes a double differentiator circuit for forming the second derivative of the input signal. A peak-to-peak detector circuit is employed to form a signal representing the peak-to-peak level of the input signal. A noise measurement circuit is employed to rectify and average the signal's noise component. Which is added to the peak signal to form a threshold signal. Another differentiator circuit is employed for forming first derivative signals. Comparators are provided to generate gating signals whenever the first derivative signals exceed the threshold signal. A zero crossing comparator is provided for detecting whenever the second derivative signal has a zero crossing. The zero crossing comparator output is enabled by the gating signals. The gated outputs from the zero crossing comparator are employed to switch the state of a latch circuit. The output from the latch circuit is a digital signal in which the transitions between binary levels are precise and accurately represent the transitions of the input signal. When the input signal is a video representation of the dark bars and light spaces of a UPC symbol, the timing of the pulse transitions from the latch circuit accurately represent the UPC symbol.

In accordance with the above summary, the present invention achieves the objective of providing an improved signal processor which precisely and accurately determines the timing between transitions of binary levels of encoded analog signals.

The foregoing and other objects, features, and advantages of the invention will become apparent from the following more detailed description set forth in conjunction with the accompanying drawing.

BRIEF DESCRIPTIONS OF THE DRAWINGS

FIG. 3 depicts waveforms representative of the operation of the signal processor of FIGS. 1 and 2 in accordance with the present invention.

DETAILED DESCRIPTION

Figure 1:
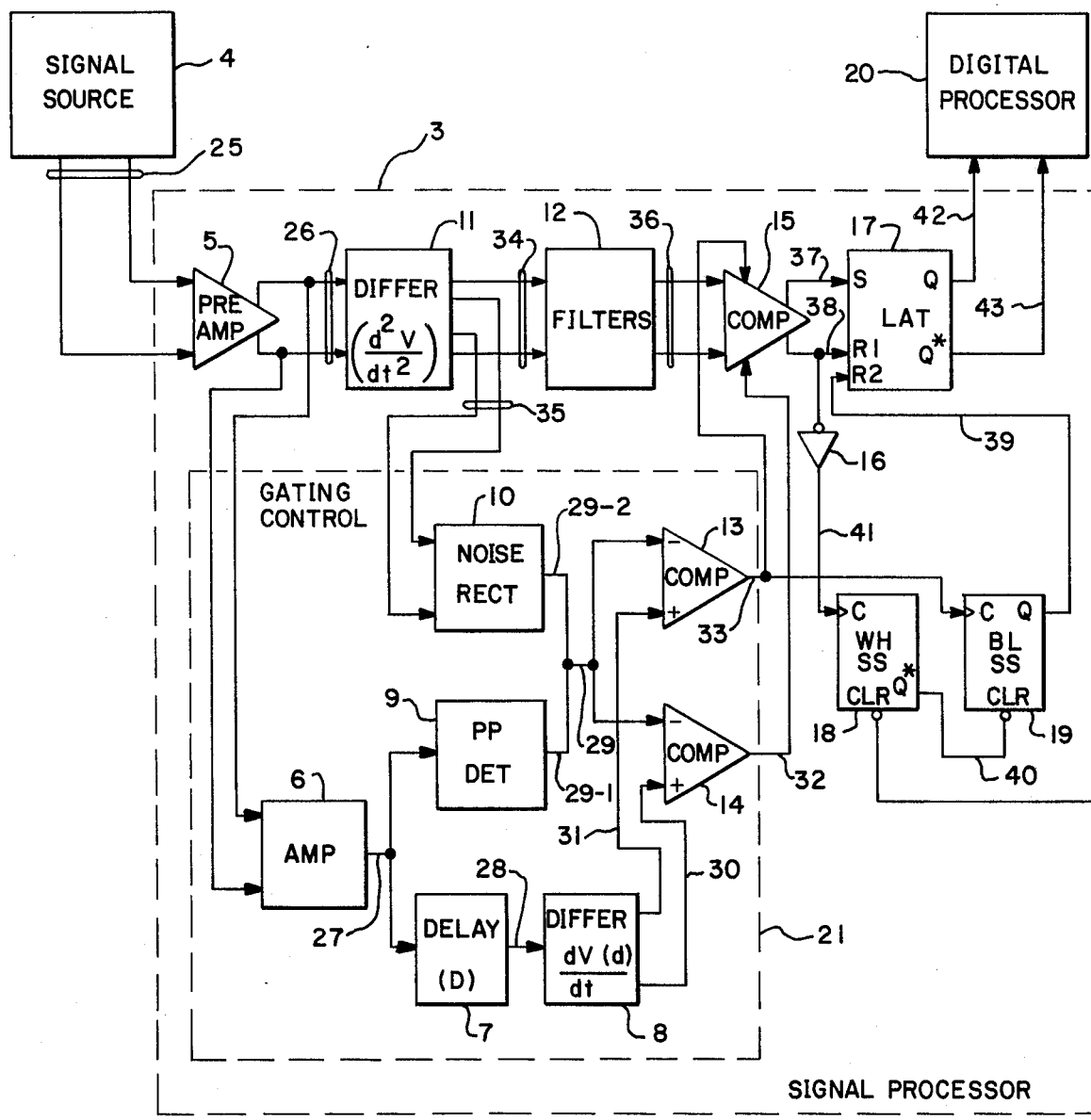
FIG. 1 depicts a block diagram representation of a signal processor in accordance with the present invention where the processor is connected between an input signal source and an output digital processor.

In FIG. 1, a signal source 4 provides an encoded analog signal on input lines 25 to the signal processor 3. The input signal on lines 25 does not have sharp transitions between levels. The signal processor 3 functions to determine precise timing for transitions in the input signal. The binary output signal on line 42 (or its complement on line 43) includes sharp transitions between levels.

In FIG. 1, the signal source 4 is typically one which scans a Universal Product Code symbol utilizing a laser beam scanner and optical detector. Such a signal source suitable for providing the input signals to the signal processor of the present invention is shown and described in the above cross-referenced application.

In FIG. 1, the digital processor 20 receives the signals on lines 42 and 43 and digitally processes those signals to determine, for example the coded information represented by the UPC symbol scanned by the signal source 4. Digital processor 20 can be any conventional digital processor designed to receive and to process the encoded information.

In FIG. 1, a differential current input signal on lines 25 from source 4 connects to a preamplifier 5. A differential voltage output signal, V, from the preamplifier 5 has a band-width of approximately 8 megahertz and connects through lines 26 to a double differentiator circuit 11 and to an amplifier circuit 6. The differentiator circuit 11 functions to double differentiate the input signal to form a second derivative signal, $d^2V/dt^2$, on lines 34. The differentiator circuit 11 is a wide-band device which does not reduce the bandwidth of the input signal. The second derivative signal on line 34 is filtered in filters 12 to reduce the band width of the second derivative signal to produce a filtered, second derivative signal on lines 36. The filters 12 are low-pass having an upper cut-off frequency of approximately 1 MHz.

The filtered second derivative signal on lines 36 is compared in comparator 15 during gating periods with a zero reference in order to detect zero crossings of the second derivative signal. Comparator 15 is activated to detect negative-going zero crossings during a gating period which occurs whenever the signal on line 33 is high. Whenever a negative-going zero crossing occurs and the gating line 33 is high, the comparator 15 output line 37 is a logical 0. Similarly, comparator 15 is operative to detect positive-going zero crossings during a gating period which occurs whenever the gating line 32 is high. Whenever a positive-going zero crossing occurs when gating line 32 is high, the output line 38 from comparator 15 is a logical 0. Only one of the lines 37 or 38 is 0 at any given time although both lines 37 and 38 are normally 1's at the same time.

The gating signals on lines 32 and 33 are derived from the gating control circuitry 21. The control circuitry 21 receives the differential voltage input signal on lines 26 as an input to the amplifier 6. Amplifier 6 converts the bilateral signal on lines 26 to a unilateral signal on line 27. The signal on line 27 is referenced with respect to ground but is otherwise essentially the same as the input signal on lines 26. The signal on line 27 is input to a peak-to-peak detector 9. The peak-to-peak detector 9 functions to provide a DC output signal on line 29-1 which is proportional to the peak-to-peak AC variation of the signals information content of the signal of line 27. The peak-to-peak signal on line 29-1 is designated as V(pp).

The signal on line 27 is delay circuit 7. The delay circuit 7 introduces a delay D into the input signal on line 27 which is approximately equal to delay of filters 12. The delayed signal, V(d), ouput from circuit 27 appears on line 28, and is an input to the differentiator circuit 8. Differentiator circuit 8 forms the first derivative of the V(d) signal on line 28 and provides first derivative signals as complementary outputs on lines 30 and 31. The first derivative signal on line 31 is designated $+dV(d)/dt$ and the first derivative signal on line 30 is designated $-dV(d)/dt$. The first derivative signals on lines 30 and 31 are inputs to the comparators 14 and 13, respectively.

In FIG. 1, the control circuit 21 also receives a second derivative signal $d^2V/dt$, on lines 35 from the differentiator 11. The second derivative signal on lines 35 is essentially the same as the second derivative signal on lines 34. The noise rectifier 10 functions as a high pass filter and rectifier with a lower cut-off frequency of approximately 3MHz. The rectified noise measurement signal, V(n), appears on output line 29-2. The noise measurement signal on line 29-2, and the peak-to-peak signal on line 29-1 are algebreically added and appear as a threshold signal, [V(pp)+V(n)], on line 29. The noise signal on line 29-2 is added to the peak signal on line 29-1 so that the amplitude of the threshold signal is likely to exceed the level of noise detected by rectifier 10.

The threshold signal on line 29 is an input to both comparators 13 and 14. Comparators 13 and 14 compare the threshold signal on line 39 with the first derivative signals on lines 30 and 31 to provide gating signals as outputs on lines 32 and 33. Specifically, whenever the amplitude of the positive first derivative signal on line 31 is greater than the amplitude of the threshold signal on line 29, the output from comparator 13 on line 33 is a logical 1. If the first derivative signal on line 31 does not exceed the threshold signal on line 29, the output on line 33 is a logical 0. In a similar manner, if the first derivative signal on line 30 exceeds the threshold signal on line 29, line 32 a 1 and, if not, the signal on line 32 is a 0.

The gating lines 32 and 33 connect to the zero-crossing comparator 15. Whenever, one of the signals on lines 32 or 33 is a 1 a gating period is present during which zero crossing comparator 15 is enabled to produce a logical 0 output signal on one of the lines 38 and 37, respectively, when a zero crossing of the second derivative signal occurs. Whenever the gating signals on lines 32 and 33 are both 0's, the outputs on lines 37 and 38 are both 1's.

In FIG. 1, the logical 1 and 0 levels on lines 37 and 38 output from comparator 15 are input to a conventional set/reset latch 17. Line 37 is connected to the set (S) input and line 38 is connected to the first reset (R1) input of latch 17. A 0 on line 37 sets latch 17 to a 1 on its Q output. Similarly, a 0 on the R1 reset input to latch 17 forces the Q* (complement of Q) output to a 1 and resets the Q output to 0.

Latch 17 can also be reset with a 1 for its Q* output by a second reset (R2) input. The second reset input connects to line 39 which is derived from the Q output of a single-shot 19. Single-shot 19 is, in turn, controlled on its clear (CLR) input by a single-shot 18. Single-shots 18 and 19 are conventional retriggerable single-shots which provide a timed output after being clocked with a positive-going transition on their clock inputs (C). The single-shot 18 is clocked by line 41 which is inverted from line 38 output of comparator 15. Whenever line 38 has a 0 to 1 transition, single-shot 18 is clocked and provides a 0 on its Q output, connected to line 40, for a duration of approximately one microsecond.

A 0 on line 40 holds the single-shot 19 cleared with a 0 on its Q output. A 0 on the Q output of single-shot 19, via line 39 and the R2 input holds latch 17 reset. A 1 for the R2 input enables latch 17. After the 1 microsecond time-out period of single-shot 18, single shot 19 is free to be clocked by positive-going transitions on line 33 from comparator 13. A 0 to 1 transition from comparator 13 causes single-shot 19 to be clocked forcing the output to 1 thereby preventing latch 17 from being reset by operation of the R2 input. Single-shot 19 has approximately a 40 microsecond timeout. If a positive-going gating signal is not detected at least every 40 microseconds, the Q output of single-shot 19 goes to 0 and resets latch 17.

Figure 2:
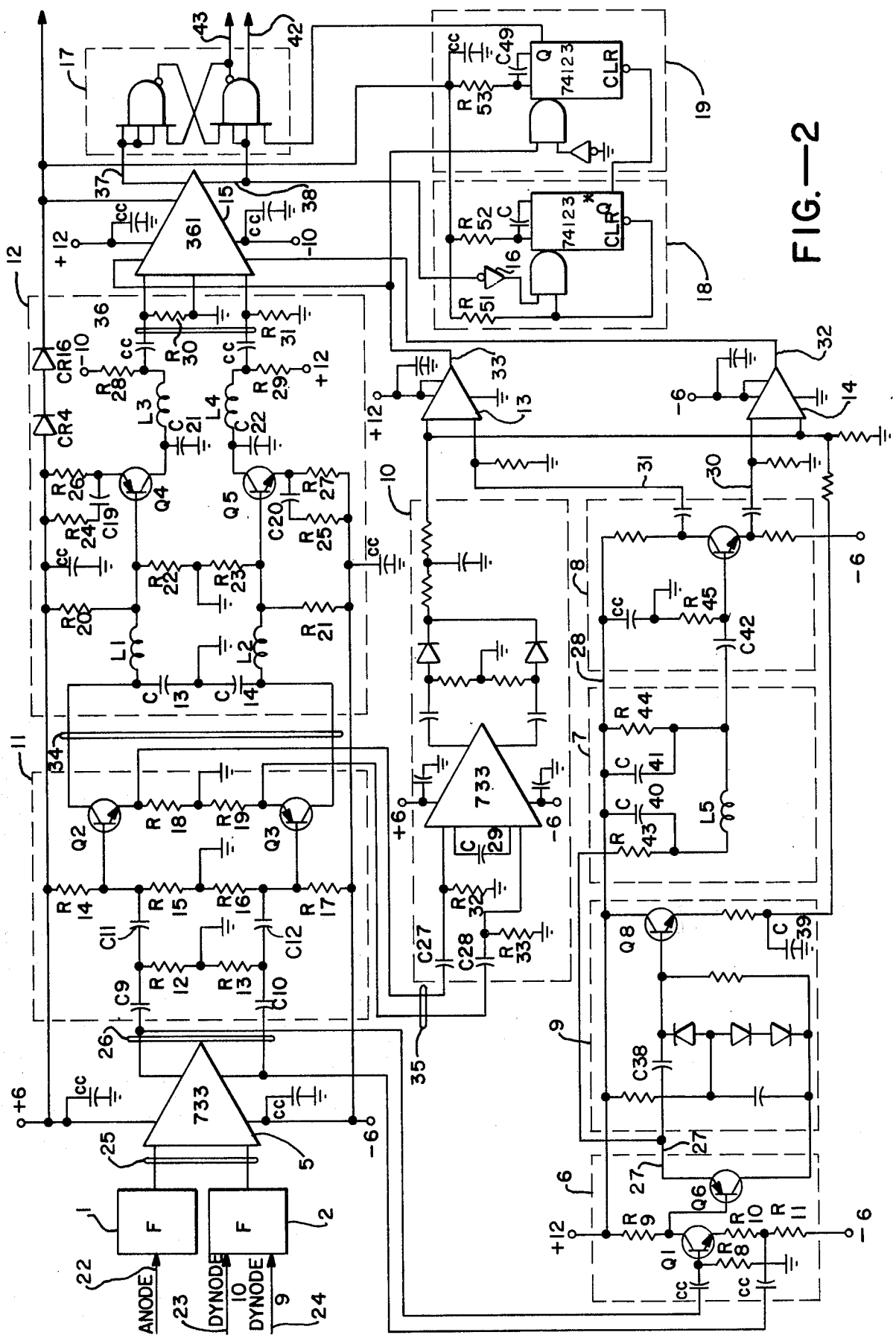
FIG. 2 depicts a detailed electrical schematic representation of one detailed embodiment of the signal processor of FIG. 1.

Further details of the signal processor 3 of FIG. 1 are shown in FIG. 2. In FIG. 2, the lines 22, 23 and 24 connect from a conventional photomultiplier tube (not shown) which is generally part of the signal source 4 of FIG. 1. The photomultiplier tube in one embodiment is a model XP1002/M manufactured by Amperex. Line 22 connects to the anode of the photomultiplier tube while lines 23 and 24 connect to the 9th and 10th (last) dynodes of the photomultiplier tube. In this manner, the output from the photomultiplier tube is connected through filters as an input to the preamplifier 5. The anode line 22 is connected through a filter 1 and the dynode lines 23 and 24 connect through a filter 2. A differential current representing the photomultiplier tube output appears on the lines 25. The signal on line 25 is then processed by the signal processor 3.

In FIG. 2, the preamplifier 5 converts the differential input current to a differential voltage on lines 26. Preamplifier 5 is any conventional device which in one embodiment is of the integrated circuit type Model 733 as manufactured by Signetics Corporation.

The output from the preamplifier 5 is a wideband, differential voltage signal which connects through the differentiators 11 and the filters 12 to the zero-crossing comparator 15. In FIG. 2 the first differentiator is of conventional design and includes the capacitor C9 and the resistor R12 in one leg, and includes the capacitor C10 and the resistor R13 in the other leg. The second differentiator is also conventional and includes the capacitor C11 and the resistors R14 and R15 in one leg, and includes the capacitor C12 and the resistors R16 and R17 in the other leg. The output signals from the differentiators are connected to the filters as inputs to the bases of transistors Q2 and Q3 which are in turn collector coupled to the bases of transistors Q4 and Q5. The transistors Q2 through Q5 serve as current sources for the filtering elements. The filters 12 have low-pass characteristics with an upper cut-off frequency of approximately 1 MHz. The filters are of the Thomson linear phase type.

In FIG. 2, a comparator 15 in one embodiment is a Model LM361 linear integrated circuit manufactured by National Semiconductor. The latch circuit 17 includes line-driving NAND gates connected in a conventional set/reset manner.

In FIG. 2, the single-shots 18 and 19 are each standard devices which are retriggerable and of linear integrated circuit type 74123.

The single-shot 18 is set with a time of approximately one microsecond which is the smallest time interval (including a safety tolerance) that it takes to scan one module (one bit) of a bar code. For example, in FIG. 3, one module is the distance from S0 to S1.

The single-shot 19 is set with a time out of approximately 40 microseconds which is determined to be the longest time interval (including a safety tolerance) that it takes to scan 4 modules (4 bits) of a character.

The single-shots 18 and 19 function to reset automatically latch 17 under conditions which are not logically possible for the particular code (e.g. UPC) being scanned. While not logically possible for the code, noise or other errors may occasionally cause the latch 17 to be set or reset at the wrong time. The single-shots 18 and 19 sense such an error and return the latch to its proper state.

In FIG. 2, the noise rectifier 10 includes an amplifier of the 733 linear integrated circuit type which is like preamplifier 5. The RC filters are selected in a conventional manner to provide a high-pass filter with a lower frequency cut-off of approximately 3 MHz.

In FIG. 2, the peak-to-peak detector operates in a conventional manner to store a voltage across capacitors C38 and C39 representing the peak-to-peak voltage of the input signal on line 27.

In FIG. 2, the RLC components in the delay circuit 7 are selected in a conventional manner to delay the signal on line 27. The delay selected is one which will render the gating signals on lines 32 and 33 in phase with a corresponding second derivative signal on lines 36, the latter being delayed in the filters 12. In the embodiment of FIG. 2, that delay has been determined to be about 1 micro-second.

In FIG. 2, the differentiator 8 forms the derivative of the delayed signal on line 28 by means of resistor R45 and capacitor C42 which are selected in a conventional manner. The transistor Q8 isolates the positive and negative complementary values of the derivative signals which are output on lines 31 and 30.

DETAILED OPERATION

The detailed operation of the signal processor 3 in FIGS. 1 and 2 is described in more detail in connection with the waveforms of FIG. 3. In FIG. 3, the designations along the lefthand margin specify descriptive signal names. The numerical designations along the righthand margin indicate the corresponding lines in FIGS. 1 and 2 where signals represented by the waveforms of FIG. 3 appear.

At the top of FIG. 3, the dark shaded areas and the intervening light areas represent a portion of one Universal Product Code (UPC) character 44. The character 44, from left to right, includes a dark area called a bar which is three modules long between S0 and S3. A second bar of character 44 is located between S4 and S5 and is module long. Finally, a bar of a new character commences at S7. The first and second bars are separated by a light space, one module long, between S3 and S4 and the second and third bars are separated by a light space, two modules long, between S5 and S7. The overall length, TR, from S0 to S7 of one character is approximately 0.09 inches in a typical embodiment. Character 44 in FIG. 3 is a UPC right 9 which includes 3 bars, 1 space, 1 bar and 2 spaces. In binary notation the character 44 is represented as 1110100.

When the character 44 is scanned by an optical pick-up of the type described in connection with signal source 4 of FIG. 1, a video signal, V, is produced on lines 25 as represented by waveform 25 in FIG. 3. The waveform V has a positive-going transition at approximately t1+ corresponding with the leading edge S0 of character 44 although the transition at T1+ of waveform V is not sharply defined. The waveform V has a negative-going transition at approximately t10+ generally corresponding with the end of the first bar at S3 but again not sharply defined. Similarly, waveform V has a positive-going transition at approximately t13+ corresponding to the leading edge S4 and a negative-going transition at approximately t16+ corresponding to the end of the second bar at S5. Finally, a positive going transition occurs in waveform V at approximately t22+ corresponding to the beginning of a bar for a new character at S7.

The waveform V as input to preamplifier 5 typically has a DC component which varies as a function of time. For example, the waveform V typically has a DC(1) value at approximately t8 and a second DC(2) value at approximately t22 where DC(2) are not equal. The DC components have magnitudes of the order of 60 microamps.

Referring to FIG. 1, the waveform V on lines 26 is converted to a differential voltage waveform on lines 26 and is transmitted to the amplifier 6. Amplifier 6 produces a signal on line 27 which has the shape of waveform V but which is tangent to ground. The signal on line 27 is delayed in delay 7 to form the delayed input signal, V(d), on line 28 as shown by waveform 28 in FIG. 3. The waveform V(d) is delayed a time period D after waveform V. The delay D is equal to approximately one microsecond. The waveform V(d) has zero crossings at points which are delayed approximately D behind the average value crossings of the waveform V.

In FIG. 3, the peak-to-peak waveform, V(pp), represents the AC peak-to-peak value of the waveform V. The waveform V(pp) appears on output line 29-1 from the peak-to-peak detector 9 of FIG. 1.

In FIG. 3, the noise level measurement waveform V(n) is representative of the signal on line 29-2 output from the noise rectifier 10 of FIG. 1. When the waveforms V(pp) and V(n) are algebraically added, the resultant threshold waveform, [V(pp) + V(n)], is representative of the signal on line 29 in FIG. 1. In FIG. 3, the threshold waveform [V(pp) + V(n)] is drawn superimposed over the first derivative waveforms +dV(d)/dt and −dV(d)/dt. Those derivative waveforms represent the signals on lines 31 and 30, respectively, from the differentiator circuit 8 of FIG. 1.

The first derivative signals on lines 30 and 31 are compared with the threshold signal on line 29 in the comparators 13 and 14, respectively. Whenever the positive first derivative signal, +dV(d)/dt exceeds the threshold signal, [V(pp) + V(n)], on line 29, the output, C1, from comparator 33 is 1. As shown in FIG. 3, the positive first derivative signal exceeds the threshold signal at times t2.4 until t3.6, and again from t14.5 until t15.6, and then finally again from t23.7 until t24.6. Accordingly, the waveform C1 representative of the signal on line 33 is a 1 from t2.4 until t14.5 until t15.6 and finally from t23.7 until t24.6.

In a similar manner the negative first derivative signal, −dV(v)/dt, exceeds the threshold signal as shown in FIG. 3 between t11.4 and t12.5, and again between t17.6 and t18.6. Therefore the waveform C2 is a 1 between t11.4 and t12.5 and again between t17.6 and t18.6.

In FIG. 3, the positive second derivative signal, $+d^2V/dt^2$ represents the signal on lines 36. Negative-going zero crossings of the second derivative signal are detected whenever the C1 gating signal is a logical one. Positive-going zero crossings of the second derivative signal are detected whenever the gating signal C2 is a 1.

In FIG. 3, the gating signal C1 is 1 between t2.4 and t3.6. A zero crossing of the second derivative signal occurs at t3.1. The zero crossing can be detected any time during the period between t2.4 and t3.6. When the zero crossing occurs at t3.1, waveform S is switched from 1 to 0 and remains a 0 until the transition of the C1 gating signal at t3.6. In a similar manner, gating waveform C1 enables a zero crossing to be detected between t14.5 and t15.6. Specifically, the zero crossing occurs at t14.9 and the S waveform is a 0 between t14.9 and t15.6. In a similar manner, the S waveform is again switched to zero at t24.1 at the zero crossing of the second derivative signal and switched back to 1 at t24.6, the transition of C1 gating pulse.

Positive-going zero crossings of the second derivative waveform are detected whenever the gating waveform C2 is a 1. Specifically, between t11.4 and t12.5, the R1 line 38 from comparator 15 switches from 1 to 0 at the zero crossing time t12.2 and remains 0 until t12.5. In a similar manner, gating waveform C2 is 1 between t17.6 and t18.6. When the zero crossing occurs at t18, the R1 waveform is switched to 0 and remains there until the end of the gating pulse at t18.6.

The Q output from latch 17 appears on line 42 in FIG. 1 and as the corresponding waveform in FIG. 3. The latch 17 is switched states with a 0 on the set (S) input or on the reset inputs (R1 or R2). Under typical operation, the R2 input remains a 1 so that the latch 17 is switched states by operation of the S and R1 inputs.

In FIG. 3, a 1-to-0 transition in the S waveform at t3.1 forces the Q output on line 42 to a 1. At t12.2, a 1-to-0 going pulse on the R1 input latch 17 switches the Q output to 0. At t14.9. a 1-to-0 going pulse on the S input again switches the Q output to 1 until at t18 a 0 S input switches the Q output to 1.

The Q waveform representing the signal on line 42 has transitions which correspond to the edge of the dark and light areas of the character 44. Specifically, the 1 between t3.1 and t12.2 represents the dark bars between S0 and S3. The 1 between t12.2 and t14.9 represents the light space in character 44 between S3 and S4. Similarly, the 1 between t14.9 and t18 represents the dark bar between S4 and S5. Finally the 0 between t18 and t24.1 represents the light space between S5 and S7.

While the invention has been particularly shown and described with reference to preferred embodiments thereof, it will be understood by those skilled in the art that the foregoing and other changes in form and details may be made therein without departing from the spririt and scope of the invention.

We claim:

1. A method for determining the occurrence of transitions in a binary encoded analog input signal comprising,
   differentiating said input signal to form a first derivative signal,
   generating a threshold signal,
   generating a gating signal to establish a gating period when said first derivative signal exceeds said threshold signal,
   forming a second derivative signal as the second derivative of said input signal, said second derivative signal having zero crossings,
   detecting said zero crossings during said gating period to determine transitions in said input signal.

2. The method of claim 1 including the step of peak detecting said input signal to generate said threshold signal.

3. The method of claim 1 including the step of peak-to-peak detecting said input signal to generate said threshold signal.

4. The method of claim 1 including the steps of peak-to-peak detecting said input signal to form a peak-to-peak signal, generating a noise measurement signal, and adding said peak-to-peak signal and said noise measurement signal to form said threshold signal.

5. The method of claim 4 including the step of filtering said input signal with a high-pass filter to form a filtered signal and rectifying said filtered signal to form said noise measurement signal.

6. An apparatus for determining the occurrence of transitions in a binary encoded analog input signal comprising,
- means for differentiating said input signal to form a first derivative signal,
- threshold means for generating a threshold signal,
- means for generating a gating signal to establish a gating period when said first derivative signal exceeds said threshold signal,
- means for forming a second derivative signal as the second derivative of said input signal, said second derivative signal having zero crossings,
- means for detecting said zero crossings during said gating period and thereby determining transitions in said input signal.

7. The apparatus of claim 6 wherein said threshold means includes means for peak detecting said input signal to form said threshold signal.

8. The apparatus of claim 6 wherein said threshold means includes means for peak-to-peak detecting said input signal to form said threshold signal.

9. The apparatus of claim 6 wherein said threshold means includes means for peak-to-peak detecting said input signal to form a peak-to-peak signal and said noise measurement signal to form said threshold signal.

10. The apparatus of claim 9 wherein said means for forming said measurement signal includes high-pass filter means for forming a filtered signal and rectifier means for rectifying said filtered signal to form said noise measurement signal.

11. An apparatus for determining the occurrence of transitions in a binary encoded analog input signal where the input signal is provided by a signal source as a differential signal having an initial large frequency bandwidth and having an information component within said initial bandwidth, said apparatus comprising,
- a preamplifier for receiving said input signal to form a preamplified signal,
- a double differentiator for forming the second derivative of said preamplified input signal to form a second derivative signal,
- filter means for filtering said second derivative signal to select frequencies containing said information component to provide a filtered second derivative signal,
- zero-crossing comparator means, operative when gated, for detecting zero crossings of said filtered second derivative signal, and responsively providing a comparator signal,
- gating control means for providing a gating signal to gate said zero-crossing comparator means,
- latch means having binary states and connected to switch states in response to said comparator signal and thereby determine the occurrence of transitions in said binary encoded analog input signal.

12. The apparatus of claim 11 wheren said gating control means includes,
- means for delaying said preamplified input signal to form a delayed input signal,
- means for differentiating said delayed input signal to form a first derivative signal,
- means for peak-to-peak detecting said preamplified input signal to form a peak-to-peak signal,
- means for filtering said second derivative signal to exclude signals having said information component to form a filtered signal,
- means for rectifying said filtered signal to form a noise measurement signal,
- means connecting said peak-to-peak signal and said noise measurement signal together whereby they are added to form a threshold signal,
- threshold comparator means for comparing said threshold signal with said first derivative signal and generate said gating signal when said first derivative signal is greater than said threshold signal.

13. The apparatus of claim 12 wherein said means for differentiating includes means for forming complementary positive and negative first derivative signals and wherein said threshold comparator means includes first and second comparators for comparing said positive and negative first derivative signals with said threshold signal, respectively.

14. The apparatus of claim 12 wherein said filter means includes means for filtering said second derivative signal with an upper cut-off frequency of approximately 1 megahertz and wherein said means for filtering includes means for filtering said second derivative signal with a lower cut-off frequency greater than approximately 1 megahertz.

15. The apparatus of claim 11 including reset means responsive to said gating control means and said threshold comparator means for resetting said latch means when transitions have not occurred within predetermined times.

* * * * *